(12) United States Patent
Price et al.

(10) Patent No.: US 8,729,898 B2
(45) Date of Patent: May 20, 2014

(54) SHIM COILS AND SHIMMING MINIATURIZED NUCLEAR MAGNETIC RESONANCE MAGNETS

(75) Inventors: John C. Price, Longmont, CO (US); Chris Jonkman, Broomfield, CO (US)

(73) Assignee: Picospin, LLC, Boulder, CO (US)

( * ) Notice: Subject to any disclaimer, the term of this patent is extended or adjusted under 35 U.S.C. 154(b) by 165 days.

(21) Appl. No.: 13/170,896

(22) Filed: Jun. 28, 2011

(65) Prior Publication Data

US 2011/0316535 A1  Dec. 29, 2011

Related U.S. Application Data

(60) Provisional application No. 61/359,732, filed on Jun. 29, 2010.

(51) Int. Cl.
*G01V 3/00* (2006.01)

(52) U.S. Cl.
USPC .......................................... 324/319; 324/320

(58) Field of Classification Search
USPC .......................................... 324/320, 319, 318
See application file for complete search history.

(56) References Cited

U.S. PATENT DOCUMENTS

| | | |
|---|---|---|
| 3,597,633 A | 8/1971 | Hirano |
| 3,622,869 A * | 11/1971 | Golay ............................ 324/320 |
| 3,735,306 A | 5/1973 | Kabler et al. |
| 4,761,614 A | 8/1988 | Prammer et al. |
| 4,782,295 A | 11/1988 | Lew |
| 4,785,245 A | 11/1988 | Lew et al. |
| 5,004,974 A | 4/1991 | Cattaneo et al. |
| 5,654,636 A | 8/1997 | Sweedler et al. |
| 5,684,401 A | 11/1997 | Peck et al. |
| 5,773,976 A | 6/1998 | Sakakura et al. |
| 5,858,154 A | 1/1999 | Toki |
| 6,097,188 A | 8/2000 | Sweedler et al. |
| 6,456,072 B1 | 9/2002 | Webb et al. |
| 6,507,190 B1 * | 1/2003 | Hinks et al. .................... 324/307 |
| 6,600,401 B2 * | 7/2003 | Zuk et al. ....................... 335/299 |
| 6,788,061 B1 | 9/2004 | Sweedler et al. |

(Continued)

OTHER PUBLICATIONS

Y. Maguire et al., Toward a table-top quantum computer, IBM Systems Journal, vol. 39 Nos. 3&4, 2000, pp. 823-939.

(Continued)

*Primary Examiner* — Louis Arana
(74) *Attorney, Agent, or Firm* — Michael C. Staggs

(57) ABSTRACT

A capillary cartridge assembly for positioning a sample fluid at a geometric center between juxtaposed pole pieces of a NMR magnet assembly for NMR analysis comprises a capillary captured in a channel in a printed circuit board assembly that is sized to fit between the pole pieces. The assembly includes a RF coil surrounding a portion of the capillary. Electric traces shaped to function as shim coils can be included in the printed circuit board. An end of the printed circuit board includes electrically conductive contacts that plug into a receptacle to connect the RF coil and traces to external electrical circuitry when the RF coil is in the geometric center. The capillary can be a continuous flow-through capillary or a closed cartridge.

6 Claims, 6 Drawing Sheets

(56) References Cited

U.S. PATENT DOCUMENTS

| | | |
|---|---|---|
| 6,822,454 B2 | 11/2004 | Peck et al. |
| 7,141,978 B2 | 11/2006 | Peck et al. |
| 2002/0140425 A1 | 10/2002 | Prammer et al. |
| 2002/0149369 A1 | 10/2002 | Peck et al. |
| 2003/0020476 A1 | 1/2003 | Duensing |
| 2005/0030033 A1 | 2/2005 | Peck et al. |
| 2005/0253587 A1 | 11/2005 | Peck et al. |
| 2006/0213283 A1 | 9/2006 | Morris et al. |
| 2007/0132452 A1 | 6/2007 | Alsop |
| 2007/0164737 A1 | 7/2007 | Pusiol |
| 2008/0136416 A1 | 6/2008 | Goetz et al. |
| 2008/0186024 A1 | 8/2008 | Edwards |
| 2011/0137589 A1 | 6/2011 | Leskowitz et al. |

OTHER PUBLICATIONS

Andrew G. Webb, Radiofrequency Microcoils in Magnetic Resonance, Jan. 27, 1997, Department of Electrical and Computer Engineering, University of Urbana-Champaign.

Odeblad, Coils for Microgram Samples and the Associated Circuitry, 1966, Acta Obstet Gynecol Scand, vol. 45, chptr 9, pp. 84-98 (downloaded from informahealthcare.com by University of Colorado Libraries on Aug. 10, 2010).

Alison Nordon, Colin A. McGill and David Littlejohn, Process NMR Spectrometry, Jan. 25, 2001, Department of Pure and Applied Chemistry, Glasgow, UK.

* cited by examiner

Multilayer Printed Wiring Board Shim Coils

4.3 Shim Coil Magnetic Field Calculation

Shim Coil Magnetic Field Calculation

SHIM COILS AND SHIMMING MINIATURIZED NUCLEAR MAGNETIC RESONANCE MAGNETS

CROSS REFERENCE TO RELATED APPLICATIONS

The present application is based upon and claims the benefit of U.S. Provisional Patent Application No. 61/359,732, titled "Shim Coils and Shimming Miniaturized Nuclear Magnetic Resonance Magnets," filed Jun. 29, 2010, by John C. Price. The entire content of the above-mentioned application is hereby specifically incorporated herein by reference for all it discloses and teaches.

BACKGROUND OF THE INVENTION

Nuclear magnetic resonance (NMR) techniques are widely used for analyzing properties of fluids and solids. NMR instruments may be placed into three classes: 1) magnetic resonance imaging (MRI) devices, which emphasize high spatial resolution; 2) NMR spectrometers, which have little or no spatial resolution but are able to resolve nuclear resonances that are closely-spaced in frequency; 3) time-domain NMR devices with neither spatial nor frequency resolution. In general, but recognizing there are many exceptions, MRI devices are used primarily in medicine and biological research to image live organisms, NMR spectrometers are used by chemists and biochemists to analyze structures of molecules, and time-domain NMR instruments are used to analyze materials properties at a coarser level than the molecular scale.

Nearly all modern NMR spectrometers are large (greater than 1 m$^3$) and use superconducting magnets cooled to cryogenic temperatures. The magnet systems and associated NMR probes and electronics are expensive (roughly $300 K to $10 M) and they require substantial facilities and maintenance support. There are also some less-powerful NMR spectrometers that use ambient-temperature permanent magnets. These machines are similar in size to the smallest of the superconducting magnet systems, but are somewhat less expensive to purchase and maintain.

The power of NMR spectroscopy for chemical analysis derives from its ability to resolve small "chemical shifts" of the nuclear magnetic resonances due to differing chemical environments. For example, the magnetic resonance frequency of hydrogen nuclei (protons) in a $CH_3$ chemical group within a liquid alkane differs from the resonance frequency of the protons in a $CH_2$ group by about 0.5 parts-per-million (ppm). Nearly all chemical shifts of protons in organic molecules are in the range 0 to 12 ppm. Chemical shift ranges are larger for some nuclear species and smaller for others. Because of the widespread application of proton NMR and the central role of hydrogen in organic chemistry, an NMR device is not usually considered to be a spectrometer unless it can resolve most proton chemical shifts. For our purposes, we define an NMR spectrometer to be an instrument with resolution better than 1.0 ppm for protons. Thus, time-domain NMR devices have spectral resolution poorer than 1.0 ppm and do not have spatial resolution.

In typical NMR spectrometers, a sample is placed in a region of uniform magnetic field. A wire coil and electronic circuits are provided to both apply radio-frequency (RF) pulses to the sample (transmit) and to detect RF signals from the sample (receive). In a typical experiment or measurement, the protons (or other nuclei under study) in the sample are first allowed to polarize in the magnetic field. Establishing equilibrium polarization takes a time which is known as $T_1$ in the NMR art. This time ranges from a fraction of a second up to 20 seconds, depending on the composition of the liquid sample. Next, one or more RF pulses are applied to the sample with frequencies at or near the resonance frequency at which the protons freely precess in the applied uniform magnetic field. The transmit pulses have the effect of tilting the proton polarization relative to the direction of the applied field. After the transmit pulse is ended the protons precess and create a time-varying magnetic field in the coil. The time-varying field induces a signal voltage in the coil which may be amplified and recorded. Either immediately, or after a delay time, the receive signal is recorded and transferred to a computer for processing.

A particular sequence of transmit pulses, delay times and data acquisition periods, together with all of the parameters needed to precisely define the sequence (times, frequencies, phases, acquisition rates) is known in the NMR art collectively as a pulse sequence. The design of NMR pulse sequences to extract desired information from a sample is a well-developed area of knowledge. A great variety of pulse sequences are known in the art, ranging from simple ones with a single transmit pulse and a single data acquisition time to much more complex sequences with many transmit pulses, time delays, transmitter phase and amplitude adjustments, and data acquisition periods. The goals of these sequences vary widely, including enhancement of spectroscopic resolution, enhancement of signal-to-noise ratio, detection of spin-spin coupling between different groups of protons (or other nuclei), suppression of strong solvent signals, suppression of coupling between like or unlike nuclei, transfer of polarization from one group of nuclei to another, measurement of relaxation rates, measurement of diffusion within the fluid and measurement of fluid flow.

Permanent magnets can be, and often are, used to create the uniform magnetic field. Such permanent magnets typically used for this purpose are made from hard magnetic material with high remnant magnetization, such as neodymium iron boron or samarium cobalt. Permanent magnets of this type have large temperature coefficients of magnetization, typically in the range 300 to 2000 ppm/° C. Because the magnetic resonance frequencies are proportional to the applied magnetic field, this implies that permanent magnet NMR spectrometers have temperature coefficients of the resonance frequencies also in the range 300 to 2000 ppm/° C. To achieve spectral resolution below 1 ppm, this temperature coefficient has to be negated, stabilized, or compensated for in some way. Methods known in the art, as applied to larger NMR spectrometers, include use of a temperature compensating magnetic material within the magnet, temperature control of the magnet, and the field-frequency lock method.

The best magnetic uniformity of most typical permanent magnet assemblies used for NMR devices is at the geometrical center of the magnet assembly, so the main channel RF coil is typically placed at the geometrical center of the magnet assembly for best NMR signal resolution. Some magnetic field shimming can be used to increase uniformity of the magnetic field produced by the magnet assembly, if necessary or desired.

The foregoing examples of related art and limitations related therewith are intended to be illustrative and not exclusive. Other limitations of the related art will becomes apparent to those skilled in the art upon a reading of the specification and a study of the drawings.

BRIEF DESCRIPTION OF THE DRAWINGS

The accompanying drawings, which are incorporated herein and form a part of the specification, illustrate some, but not the only or exclusive, example embodiments and/or features. It is intended that the embodiments and figures disclosed herein are to be considered illustrative rather than limiting.

In the drawings.

DESCRIPTION OF PREFERRED IMPLEMENTATIONS

Magnetic field shimming for increasing uniformity of magnetic fields is well-known in the NMR field and can be accomplished by any of a variety of techniques. One of such techniques known in the NMR art as an effective method for improving magnetic field homogeneity involves the use of shim coils. In large NMR spectrometers, shim coils cost-effectively relax the requirements on the un-shimmed field homogeneity and on the mechanical and magnetic precision required in the magnet construction. Techniques for designing shim coils are known in the art and are the subject of many technical publications, as are computational techniques for simulating fields that shim coils produce. Most shim coil designs are intended for use in superconducting solenoidal magnets and involve current-carrying conductors placed on one or more cylindrical surfaces.

Shim coils are also known in the art that are intended to be placed between the parallel pole faces of large permanent magnets and electro-magnets, and methods for designing these shim coils are known and have been described in NMR literature. In such shim coil sets, the conductors are generally placed on two or more parallel surfaces that are perpendicular to the field direction. These surfaces are also parallel to the mutually parallel pole faces in those cases where planar pole faces are used. However, for very small or miniature permanent magnet NMR devices, for example, the miniaturized NMR spectrometer illustrated in FIG. 3, it becomes challenging to arrange the many conductors needed in the very limited space available. For example, it may be necessary to arrange pairs of coils intended to produce the 8 harmonic functions (described below) in a narrow pole gap of, for example, just 1.0 to 10 mm. In the example prototype miniaturized NMR spectrometer shown in FIG. 3, the gap 30 between the pole faces 7, 77 was just 5.0 mm.

Figure 1:
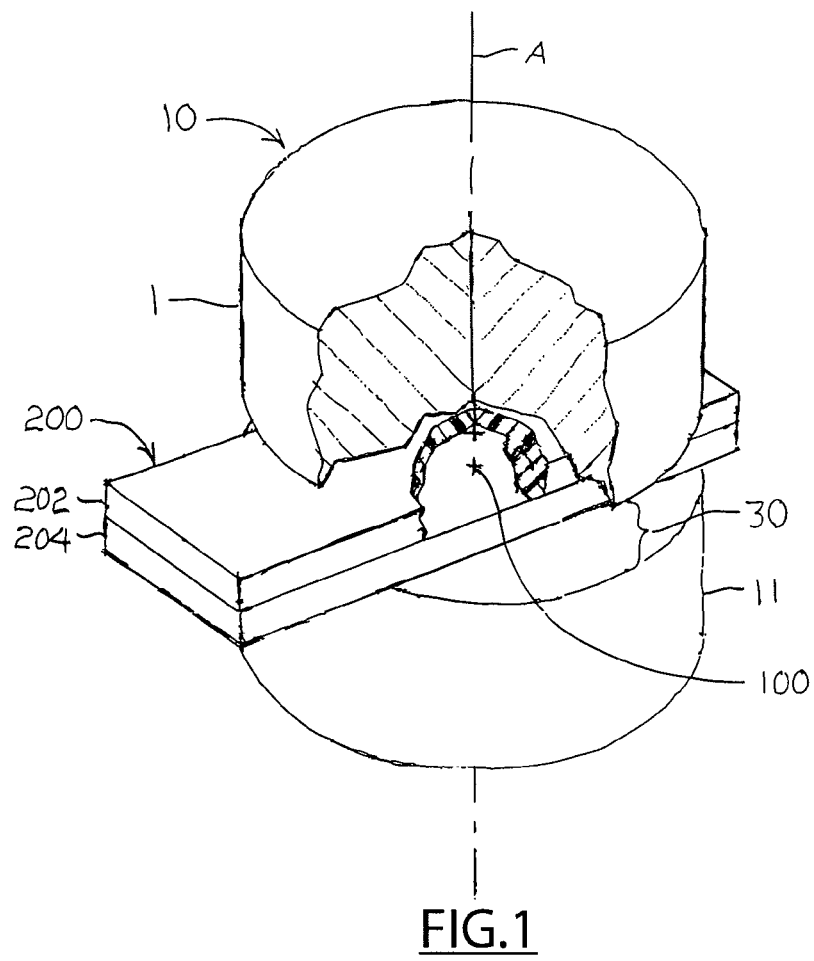
FIG. 1 is an isometric diagrammatic view of an example shim coil set comprising two multilayer printed circuit boards positioned between two magnets to be shimmed, with portions of one of the magnets and one of the multilayer printed circuit boards diagrammatically cut away to reveal the geometric center of the magnet assembly in relation to the shim coil set.
Figure 2:
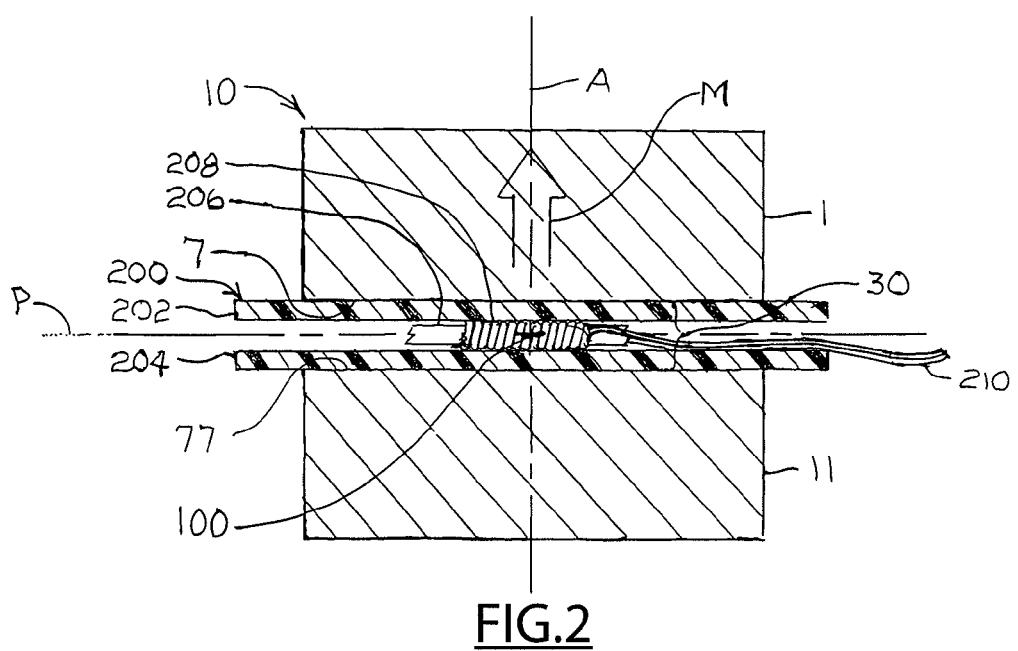
FIG. 2 is a cross-section diagrammatic view of an example shim coil set with the two multilayer printed circuit boards spaced apart from each other to accommodate a coil and sample tube at the geometric center of the magnet assembly.
Figure 3:
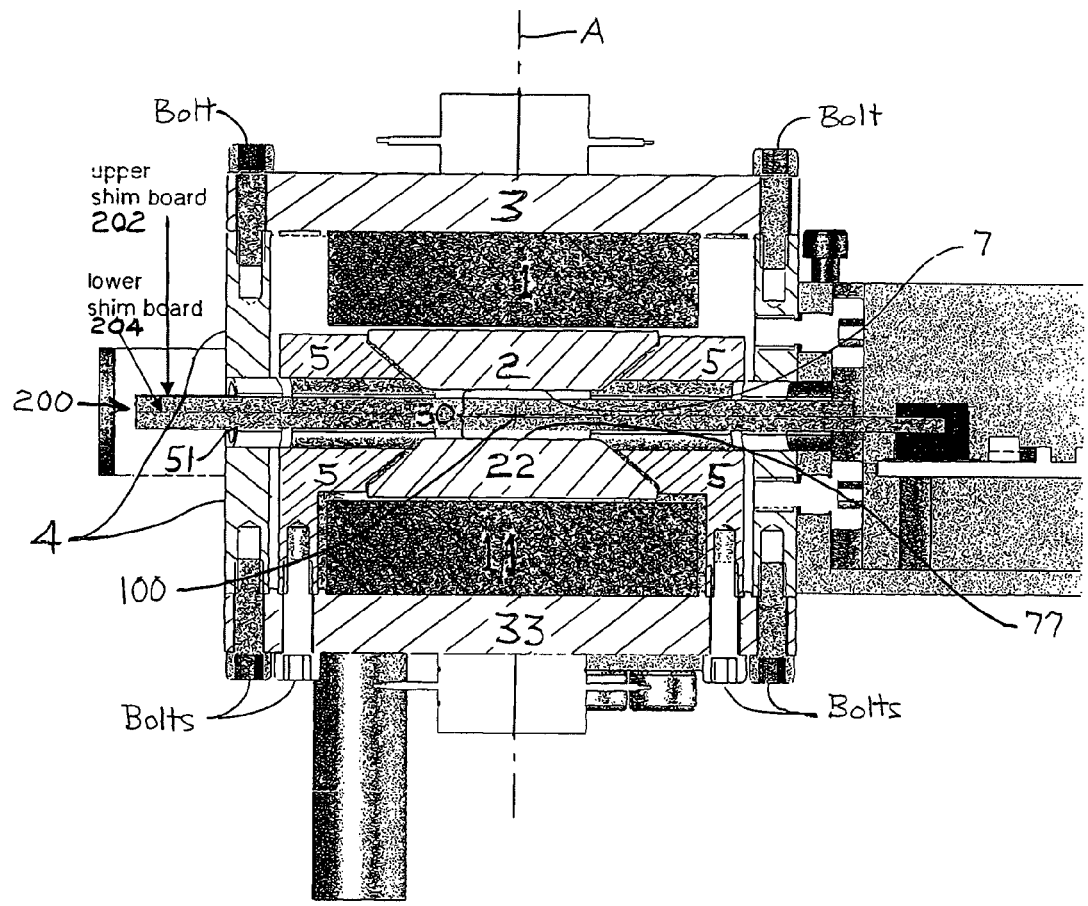
FIG. 3 is a cross-section diagrammatic view of an example miniature nuclear magnetic resonance device fitted with the example shim coil set.
Figure 4:
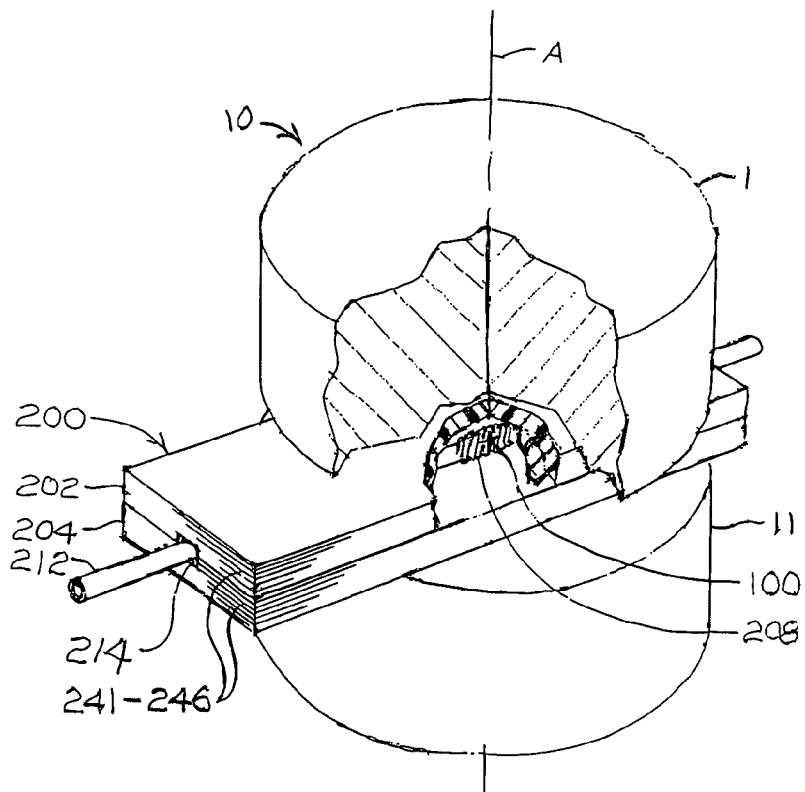
FIG. 4 is an isometric diagrammatic view of an example shim coil set with a longitudinal groove through its center to accommodate a flow-through sample tube.

In an example implementation to shim magnetic fields in such very small, tight spaces between magnets, a shim coil set 200 comprising two mutually parallel planar multilayer printed circuit boards (MPCBs) 202, 204 are arranged symmetrically above and below a plane P perpendicular to the magnetic field M and passing through the center 100 of the magnet assembly 10 where the NMR sample is normally located, as illustrated diagrammatically in the cross-sectional view of FIG. 2. The two MPCBs 202, 204 may be in mutual contact as shown in FIGS. 1 and 3, or there may be space between them as shown in FIG. 2. In the case where there is a space between them as shown in FIG. 2, the NMR sample 206, NMR RF coil or coils 208, and wiring 210 for the RF coil or coils 208 may be placed in the space. Alternately, one or more of the RF coils may be implemented as a layer in one or both MPCBs 202, 204. In the case where the two MPCBs are in mutual contact, cavities (not shown) must be created in the MPCBs 202, 204 to allow space for the NMR sample 206. The RF coil or coils 208 may also be placed in cavities (not shown) or they may be implemented as layers in one or both MPCBs 202, 204. The wiring 210 for the RF coil or coils 208 can be free strands as shown in FIG. 2 or they may be implemented as a layer or layers (not shown) in one or both MPCBs 202, 204. In the case of a capillary or flow NMR spectrometer in which a fluid channel or capillary 212 conveys a liquid sample from outside the magnet assembly 10 to the center 100 of the magnet assembly 10 where the NMR RF coils or coils 208 are located, a groove 214, as illustrated diagrammatically in FIG. 4, may be placed in one or both MPCBs 202, 204 to accommodate the fluid channel or capillary 212. Any cavities or grooves formed in the MPCBs 202, 204 must be located so as not to interrupt any of the copper wiring traces set in the MPCBs 202, 204 for the shim coils and electrical connections to the shim coils as described below.

In the example prototype implementation shown diagrammatically in FIG. 3, an example miniaturized permanent magnet assembly 10 suitable for use in creating a polarizing magnetic field for use in a smaller or miniaturized NMR device, such as a miniature NMR spectrometer, time-domain NMR device, or NMR imaging device is illustrated. In the FIG. 3 example, the major components of the magnet assembly 10, e.g., the two cylindrical permanent magnets 1, 11, the two pole pieces 2, 22, the two disc-shaped covers 3, 33, the cylindrical part 4, and the pole support 5 are shown in cross-sectioned views, so only one half of each component can be seen, but they are figures of revolution about the longitudinal axis A of cylindrical symmetry in a manner that can be understood easily by persons skilled in the art. Those components assembled as shown in FIG. 3 and described below provide high magnetic field homogeneity in a compact magnet assembly 10 and is enabling for cost-effective miniature NMR spectrometers and other small or miniature NMR devices.

The two cylindrical permanent magnets 1, 11 are the source of the magnetic field. Both permanent magnets 1, 11 are magnetized in the same direction along the axis A of cylindrical symmetry. The permanent magnets 1, 11 are preferably made from a hard magnetic material with high remnant magnetization, such as neodymium iron boron or samarium cobalt. The magnetic field is enhanced and made substantially more uniform (perfect uniformity is physically impossible) at the center 100 of the magnet assembly 10, where the NMR sample (not shown) is typically located, by the flux return 20 comprised of two disk-shaped covers 3, 33 and a cylindrical part 4. The flux return 20 is preferably made from a soft magnetic material such as iron with high saturation magnetization and low remanence. The magnetic field is further made more uniform at the sample location by pole pieces 2, 22 preferably made from a soft magnetic material such as permendur (50% Co-50% Fe or 49% Co-49% Fe-2% V) with very high saturation magnetization, low remanence, and high magnetic uniformity. The pole pieces 2, 22 are preferably in the form of truncated cones with flat and mutually parallel surfaces 7, 77 facing the region between the surfaces 7, 77 where the NMR sample (not shown) would be positioned. However, tests have shown that the exact shape of the pole pieces is not critical and pole pieces in shapes other than truncated cones can be used as long as the juxtaposed faces 7, 77 are flat and parallel. Slightly non-planar pole faces are possible, but more difficult to make correctly for enhanced homogeneity of the magnetic field. The pole support 5 is preferably made from a rigid, non-magnetic material, for example, aluminum, titanium, or a ceramic.

The neodymium iron boron permanent magnet disks 1, 11 used in the example magnet assembly 10 shown in FIG. 3 are 1.5-inch diameter and 0.375-inch thick. The gap 30 between the respective surfaces 7, 77 of the pole pieces 2, 22 is 5.0 mm and the magnet flux density at the center 100 of the magnet assembly 10 where the sample and RF coil (not shown) would be located is 1.1 Tesla, corresponding to a proton magnetic resonance frequency of 45 MHz. The pole pieces 2, 22 in the FIG. 3 example are made from permendur material containing 2% vanadium.

The resonance frequencies of atomic nuclei in an NMR magnetized fluid for analysis by NMR techniques, e.g., imaging, flow metering, spectrometry, and other applications, are directly proportional to the magnitude of the applied magnetic field. Consequently, the root-mean-square (RMS) linewidth of an NMR resonance will be greater than or equal to the RMS variation of the applied field over the volume of the sample. Field homogeneity is therefore of paramount importance in the design of magnetics in which resolution of closely spaced frequencies are needed, such as NMR magnets intended for use in spectrometers with high frequency resolution. We assume that the field is closely aligned with the z-direction in a Cartesian coordinate system, and that this direction corresponds with the axis A of cylindrical symmetry as shown in FIG. 3. We further assume that the origin of coordinates is coincident with the location of the NMR sample (not shown in FIG. 3) at the center 100 of the magnet assembly 10, the x-direction is perpendicular to the axis A and in the plane of the paper, and the y-direction is perpendicular to the axis A and extending into and out of the plane of the paper on which FIG. 3 is illustrated. Variations of the field magnitude will be dominated by variations of the z-component component of the field, which obeys the Laplace equation in empty space. Including general linear and quadratic variations with the coordinates, the field variations may be expanded as a sum of terms proportional to the following 8 harmonic functions:

$x, y, z, 3z^2-r^2, x^2-y^2, zx, zy, xy,$ where x, y, and z are the Cartesian coordinates and r is the distance from the origin. Description of field inhomogeneities in terms of these harmonic functions is commonplace in the art of NMR. Additional harmonics may be used which depend on third or fourth powers of the coordinates.

The primary design challenge for NMR magnets is to reduce the variations of the field sufficiently to allow for adequate spectral resolution, while simultaneously minimizing manufacturing costs. Because the harmonic functions decrease as the distance from the origin decreases, RMS field variations taken over the sample volume will decrease as the size of the sample decreases. Conversely, the RMS field variations can be reduced for a fixed sample size by using a sufficiently large magnet. This approach is common in the art. For example, spectrometers are known in the art with sample diameters of a few millimeters placed within permanent magnet assemblies weighing approximately 300 kg. However, for a smaller or miniature NMR spectrometer, we must use a compact magnet assembly and reduce the sample size until the resolution requirements can be met.

The sample cannot be made arbitrarily small because the NMR signal-to-noise (SNR) ratio decreases as the sample size decreases. For field strengths accessible with permanent magnets (approximately 1-2 Tesla, or proton resonance frequencies of 40 to 90 MHz), SNR becomes intolerable for all NMR spectroscopy applications for sample diameters less than 0.1 mm and is adequate for many applications for sample diameters of about 0.3 mm or larger. For definiteness, we assume in the discussion below a spherical sample with a diameter in the range of 0.1 to 1.0 mm, e.g., of 0.3 mm diameter. The disclosed magnet assembly dimensions can be scaled up or down in proportion to sample size for sample diameters other than 0.3 mm. In practice, the sample normally consists of a liquid in a capillary. The transverse dimensions of the sample are determined by the walls of the capillary and the length of the sample is determined by the geometry of the NMR receiver coil. An efficient coil has a length about equal to its diameter, so the effective sample is approximately a sphere with a diameter equal to the capillary diameter.

Figure 5:
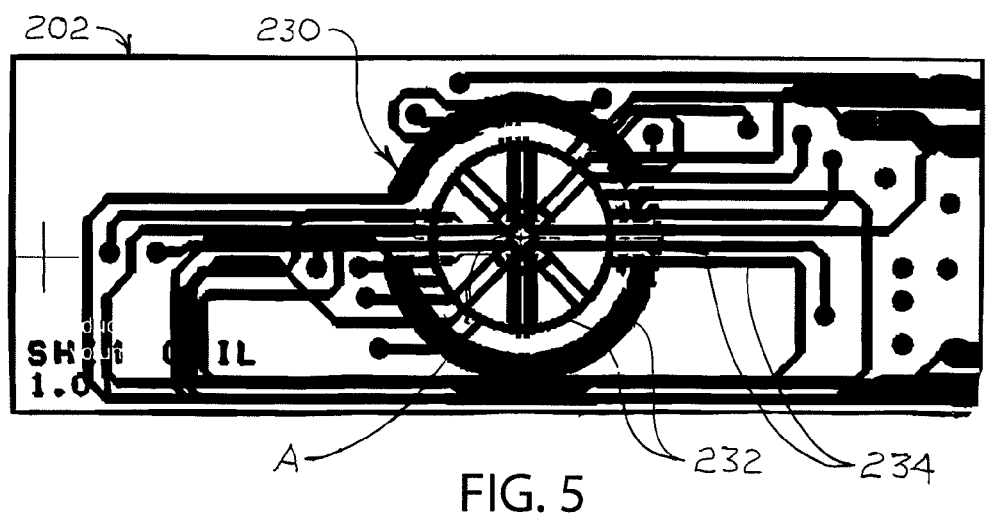
FIG. 5 is a composite plan view of one example multilayer shim board a composite of all of the shim coil traces of all of the layers in the shim board.
Figure 6A:
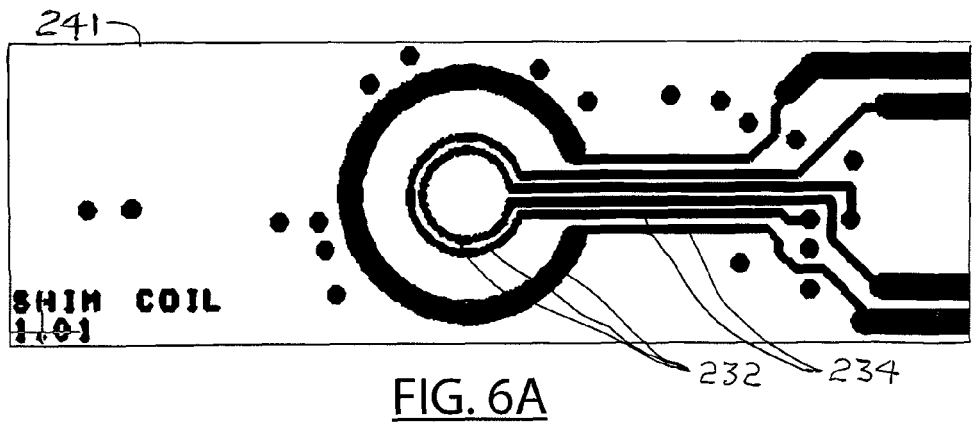
FIGS. 6A-F are plan views of the individual shim board layers illustrating diagrammatically the individual shim coil layers that make up the composite shown in FIG. 5.
Figure 6B:
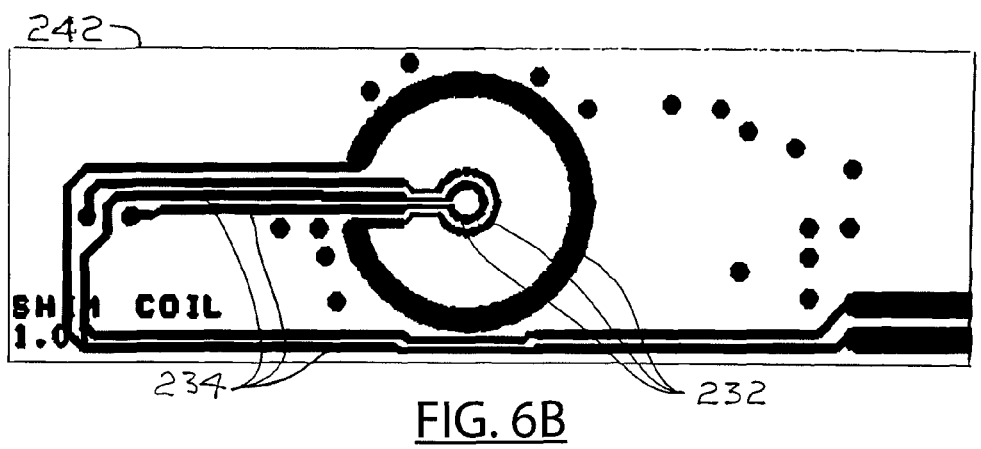
Figure 6C:
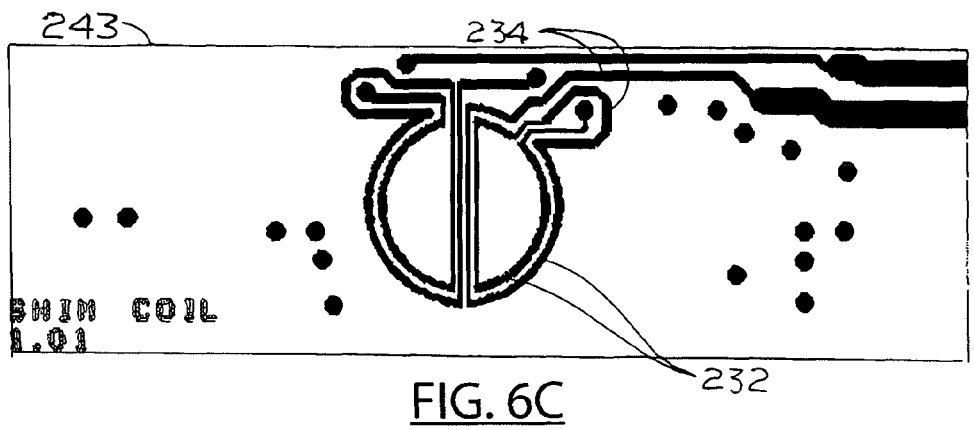
Figure 6D:
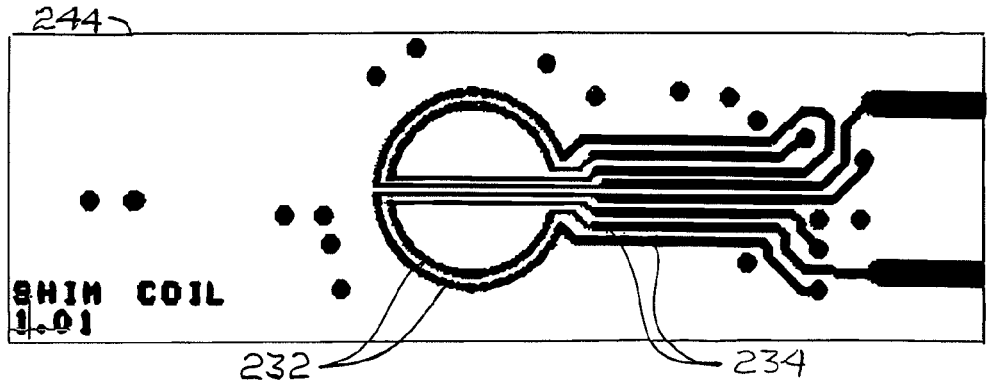
Figure 6E:
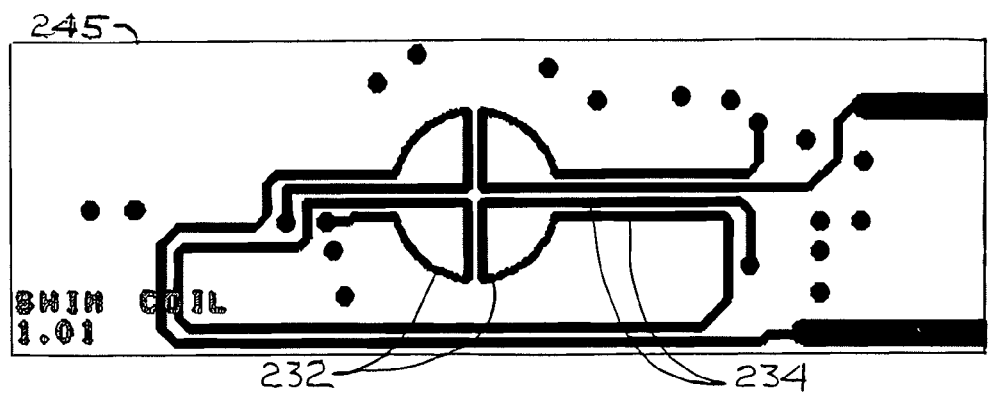
Figure 6F:
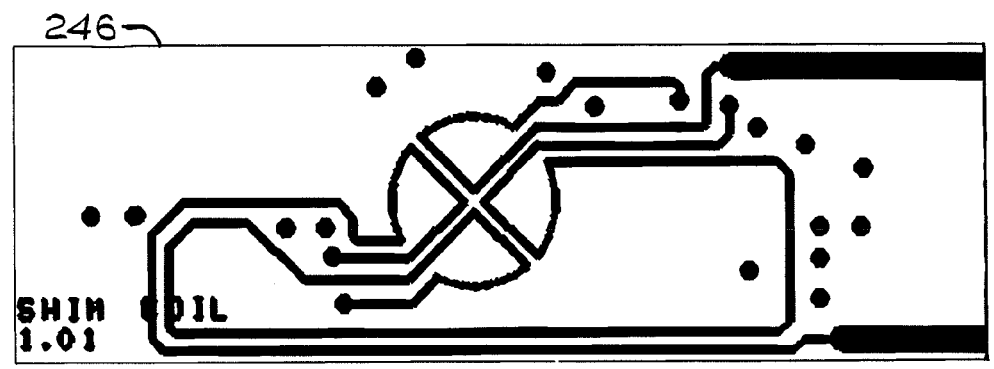

To demonstrate the utility of this approach, a pair of shim boards 202, 204 was constructed following the disclosed approach. A composite of the conductor trace patterns 230 of all of the layers of the upper shim board (MPCB) 202 that comprise the shim coils 232 and electric connectors 234 to the shim coils 232 in the upper MPCB 202 are shown in FIG. 5. When the MPCB 202 is positioned in the magnet assembly 10 as shown above in FIGS. 1-4, the center 203 of the MPCB 202 is coincident with the axis A so that the shim coil traces 232 are concentric with the axis A. The MPCB 202 has a stack of six wiring layers 241, 242, 243, 244, 245, 246, as illustrated in FIGS. 6A-6F, and two outer shield layers (not shown) laminated onto opposite sides of the stack of wiring layers 241-246. The individual shim coil traces 232 and electric connection traces 234 of each of the six layers can be seen in the respective FIGS. 6A-6F. When stacked or laminated together, the following table gives the layer ordering for the upper MPCB 202, top to bottom:

| | |
|---|---|
| Outer shield | (not shown) |
| FIG. 6A | (z and uniform field) |
| FIG. 6B | $(3z^2-r^2)$ |
| FIG. 6C | (zy, y) |
| FIG. 6D | (zx, x) |
| FIG. 6E | (xy) |
| FIG. 6F | $(x^2-y^2)$ |
| Inner shield | (not shown) |

The lower shim board (MPCB) 204 has exactly the same trace patterns and layer assembly as the upper shim board 202, but the complete assembly is flipped over 180 degrees about its long axis. Because of this arrangement, the top-to-bottom layer ordering in the lower MPCB 204 is opposite that in the upper MPCB 202. This configuration maintains symmetry of the coils 232 about the horizontal plane P (see, e.g., FIG. 2) containing the RF coil 208. There are also insulating layers or membranes (not shown) between every copper layer in the MPCBs 202, 204, to prevent shorting, as will be understood by persons skilled in the art, once they understand the principles of this invention. Besides the eight field distortions discussed in the text, the FIG. 6A coil 232 also generates a uniform field, which is useful to correct field offsets created when the currents in the other coils in the other layers are changed.

Also, while not necessary, corresponding coils in the two shim boards 202, 204 are connected in series either in a symmetric (S) sense or in an antisymmetric (A) sense. For example, the xy coil in the upper shim board 202 is in series with the xy coil in the lower shim board 204 so that the corresponding currents (as viewed from above the whole assembly 200) circulate in the same direction (clockwise, for example). However the z coils (inner loops in FIG. 6A) are connected antisymmetrically between layers so the currents circulate in opposite directions. Here is a table that says how they are all connected:

| FIG. 6A | (z, uniform field) | A, S |
|---|---|---|
| FIG. 6B | $(3z^2 - r^2)$ | S |
| FIG. 6C | (zy, y) | A, S |
| FIG. 6D | (zx, x) | A, S |
| FIG. 6E | (xy) | S |
| FIG. 6F | $(x^2 - y^2)$ | S |

In the FIG. 6A layer, there are two separate coils. The inner two turns generate the z distortion, and they are connected antisymmetrically. The outer turn generates a uniform field, and it is connected symmetrically.

The FIG. 6C layer only contains one coil. If connected antisymmetrically, it generates zy, and if connected symmetrically, it generates y. The electronics allows for both possiblities. The FIG. 6D layer is similar to the FIG. 6C layer in this regard.

As mentioned above, other layer and coil arrangements can be used within the scope of this invention.

Figure 7:
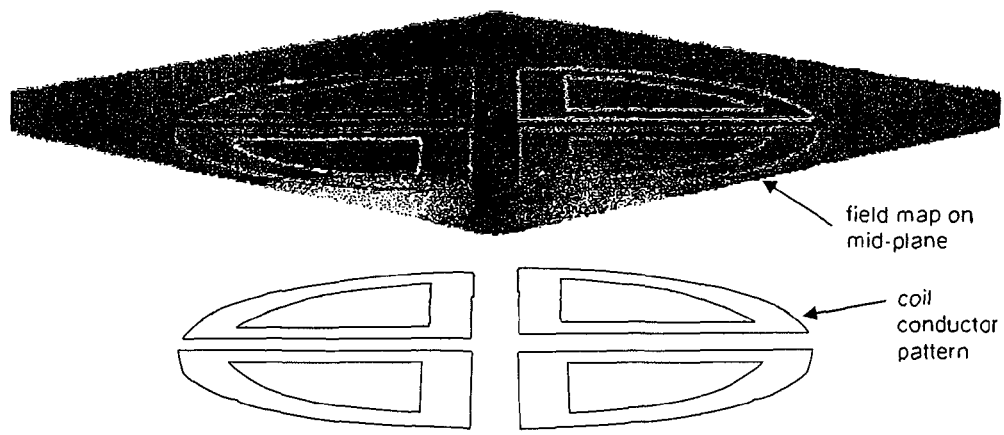
FIG. 7 is an example magnetic field map in relation to an example shim coil conductor pattern.
Figure 8:
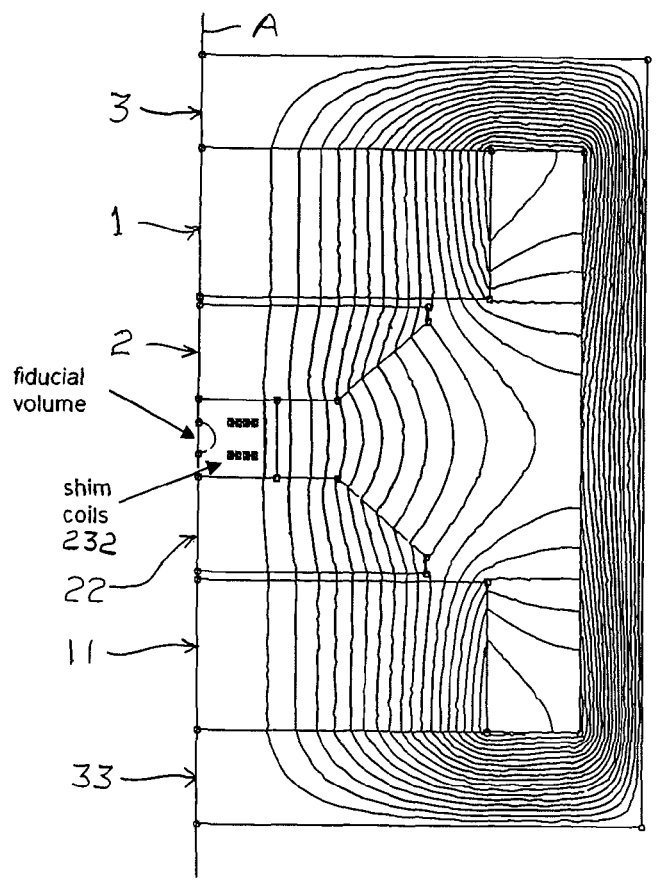
FIG. 8 is an example magnetic field computation for an example magnetic field shimmed with the shim coil set.

This shim coil set 200 is designed to create the 3 linear and 5 quadratic field harmonics given above, and, in addition, to create a uniform z-directed field. As mentioned above, the lower shim board 204 was identical to the upper shim board 202 except that the entire board 204 was flipped 180 degrees about the long dimension of the board. The harmonics generated were checked using finite element calculations. FIG. 7 shows three-dimensional finite element computation of the fields produced by the $x^2$-$y^2$ shim coil pair (see FIG. 6F). The representation output was a color plot that that does not show in the black and white FIG. 7, but which represented the magnitude of the z-component of the field on a plane perpendicular to z and passing through the origin (magnet center 100 and sample location). The upper quadrant-shaped coil is formed from copper traces within the upper shim board 202 and the lower quadrant-shaped coil is formed from copper traces within the lower shim board 204. The calculation was done using the computer program Magnum 2.8. Some of the shim coils are axially symmetry and can therefore be simulated using two-dimensional axisymmetric finite elements. FIG. 8 shows a computation for axisymmetric coils done using the Finite Element Method Magnetic FEMM 4.2. freeware computer program. Again the upper coil shown in cross-section is within the upper shim board 202 and the lower coil is within the lower shim board 204.

A complete NMR spectrometer was designed and constructed much as illustrated in FIG. 3, including the disclosed shim coils 230 implemented with a pair of MPCBs 202, 204. Before the coils were installed, the magnet assembly 10 was mapped using a Hall sensor. The field map was analyzed to yield the magnitude of the 8 linear and quadratic harmonics. The corresponding RMS field distortions over a 0.3 mm diameter sphere were found to be:

| | |
|---|---|
| x | 0.79 ppm |
| y | 2.6 ppm |
| z | 3.8 ppm |
| $3z^2 - r^2$ | 0.12 ppm |
| $x^2 - y^2$ | 0.01 ppm |
| zx | 0.36 ppm |
| zy | 0.06 ppm |
| xy | 0.01 ppm |

The total RMS field distortion due to these 8 terms was 4.7 ppm, which was equal within the uncertainly of the data to the RMS of the total field, indicating that these 8 terms give an adequate description of the field over the 0.3 mm sphere. After the mapping was complete the disclosed shim coil set 200 was installed in the magnet assembly 10, and the shim coil currents were adjust for best resolution with a sample that may be approximated as a 0.3 mm diameter sphere. The NMR spectrometer achieved a resolution of 0.12 ppm for protons, demonstrating that the disclosed shim coils are effective in a compact NMR spectrometer.

The foregoing description provides examples that illustrate the principles of the invention, which is defined by the claims that follow. Since numerous insignificant modifications and changes will readily occur to those skilled in the art once they understand the invention, it is not desired to limit the invention to the exact example constructions and processes shown and described above. The words "comprise," "comprises," "comprising," "include," "including," and "includes" when used in this provisional application are intended to specify the presence of stated features, integers, components, or steps, but they do not preclude the presence or addition of one or more other features, integers, components, steps, or groups thereof. The terms upper, upwardly, lower, bottom, top, down, downwardly, vertical, horizontal, and other directional terms in this description are in reference to the diagrammatic orientations depicted in the drawings and are only used for convenience and clarity in this description unless otherwise indicated. They are not intended to limit the magnet assembly 10 to any particular orientation in real use applications, and, in fact, the magnet assembly 10 can be positioned and used in any desired orientation. The term "magnetic material" includes any material that can be magnetized, regardless of magnetic remanance characteristics.

What is claimed is:

1. Shim coil apparatus for shimming a magnetic field in a miniature Nuclear Magnetic Resonance (NMR) assembly, comprising:
   a pair of permanent magnet pole faces,
   a first shim board configured with shim coils formed from traces on stacked layers of multiple printed circuit boards and a second shim board configured with shim coils formed from traces on stacked layers of multiple printed circuit boards, wherein the first shim board and the second shim board are configured in an opposing manner between the pair of permanent magnet pole faces to provide a gap so as to accommodate a fixed disposed capillary that can convey a liquid sample from outside the assembly to the center of the assembly.

2. The shim coil apparatus of claim 1, wherein each shim coil on a layer of printed circuit board is a mirror image axially aligned with another shim coil on another layer of printed circuit board positioned so that the magnet center is midway between such mirror image shim coils.

3. The shim coil apparatus of claim 2, wherein the mirror image shim coils are electrically connected together in series.

4. The shim coil apparatus of claim 3, wherein the mirror image shim coils are connected in a series in a symmetric (S) sense.

5. The shim coil apparatus of claim 3, wherein the mirror image shim coils are connected in series in a antisymmetric (A) sense.

6. The shim coil apparatus of claim 1, wherein the gap between the permanent magnet pole faces is configured with a width from 1.0 millimeters (mm) of up to 10 millimeters (mm).

\* \* \* \* \*